United States Patent
Iriguchi

(10) Patent No.: US 7,046,408 B2
(45) Date of Patent: May 16, 2006

(54) METHOD OF HOLOGRAM EXPOSURE, MASK FOR HOLOGRAM EXPOSURE, SEMICONDUCTOR DEVICE, AND ELECTRONIC EQUIPMENT

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/934,445

(22) Filed: Sep. 7, 2004

(65) Prior Publication Data

US 2005/0063030 A1    Mar. 24, 2005

(30) Foreign Application Priority Data

Sep. 22, 2003   (JP) ............... 2003-329777

(51) Int. Cl.
*G02B 5/32*   (2006.01)
(52) U.S. Cl. .............. 359/15; 430/1; 430/22; 356/401
(58) Field of Classification Search ........... 359/15, 359/35, 12; 430/1, 22, 30; 356/401
See application file for complete search history.

(56) References Cited

U.S. PATENT DOCUMENTS 5,504,596 A * 4/1996 Goto et al. ............... 359/24
6,329,104 B1 * 12/2001 Clube et al. ............... 430/1

FOREIGN PATENT DOCUMENTS

| JP | 02-005510 A | 1/1990 |
|---|---|---|
| JP | 03-139651 A | 6/1991 |
| JP | 04-229890 A | 8/1992 |
| JP | 06-308872 A | 11/1994 |

OTHER PUBLICATIONS

Francis Clube et al.; "P-40: 0.58μm Enabling Lithography for Low-Temperature Polysilicon Displays"; SID 03 Digest; pp. 350-353.

* cited by examiner

Primary Examiner—Leonidas Boutsikaris
(74) Attorney, Agent, or Firm—Oliff & Berridge, PLC

(57) ABSTRACT

Exemplary embodiments of the present invention provide a method of hologram exposure that is capable of making accurate alignment. A method of exposure according to one exemplary aspect of the present invention includes providing a mask for hologram exposure M2 including first alignment marks A1 through A4 that is readable with an alignment optical system 40 and a hologram exposure area D2 to which a hologram is recorded by hologram exposure so as to form a desirable coherent pattern and second alignment marks AL1 through AL4 on a substrate 10. Exemplary aspects of the invention also include performing test hologram exposure with the mask for hologram exposure aligned to the substrate based on the first alignment marks, calculating the amount of gaps ($\Delta X, \Delta Y, \Delta\theta$) between the first alignment marks and the hologram exposure area based on the second alignment marks formed on the substrate and the amount of correction ($-\Delta Xc, -\Delta Yc, -\Delta\theta$) based on the gaps, and performing hologram exposure with the mask for hologram exposure aligned to the substrate based on the amount of correction and the first alignment mark.

11 Claims, 7 Drawing Sheets

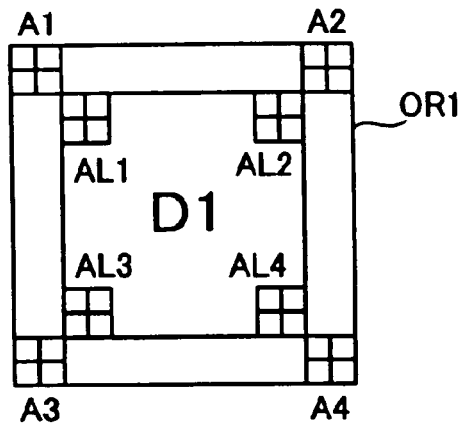
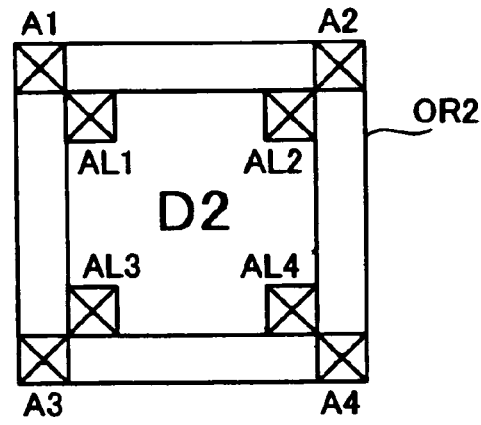
FIG. 1A          FIG. 1B
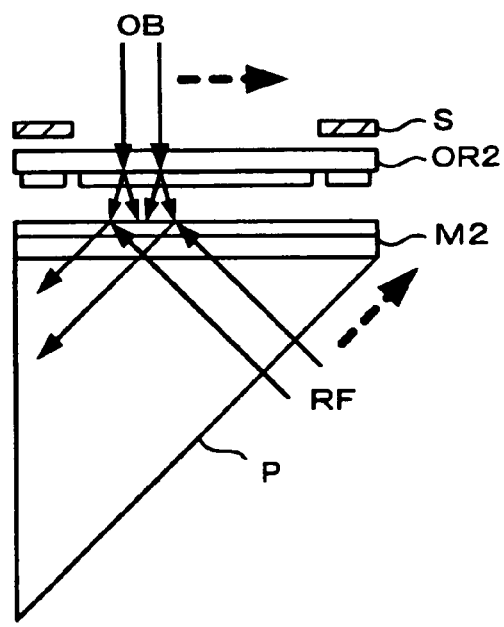
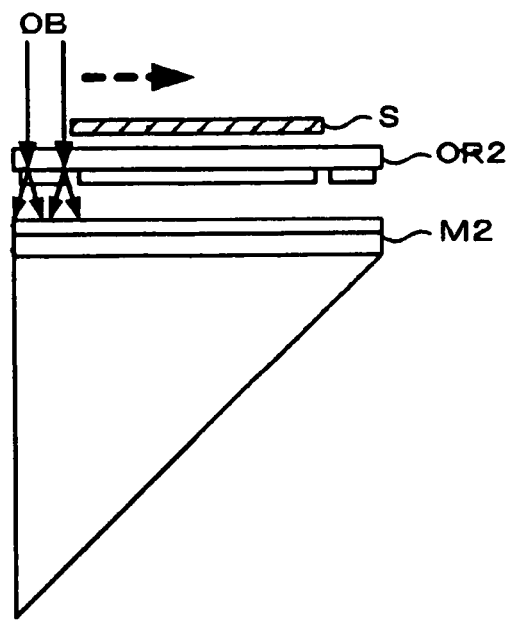
FIG. 2A          FIG. 2B

METHOD OF HOLOGRAM EXPOSURE, MASK FOR HOLOGRAM EXPOSURE, SEMICONDUCTOR DEVICE, AND ELECTRONIC EQUIPMENT

BACKGROUND OF THE INVENTION

1. Field of Invention

The present invention relates to a method of hologram exposure using light coherence to expose a photoresist applied on a substrate with a micropattern to light, and in particular to such a method that enables highly accurate alignment between a mask for hologram exposure that is used for hologram exposure and the substrate.

2. Description of Related Art

In a method of hologram exposure, a mask for hologram exposure (hologram mask) is first provided by using an original mask having a desirable pattern to be formed on a substrate. The hologram mask has a pattern apparently different from the desirable pattern to be formed on the substrate. A desirable coherent pattern is formed on the substrate by applying hologram exposure on the substrate using this hologram mask.

Related art document F. Cube, 0.5 µm Enabling Lithography for Low-Temperature Polysilicon Displays, *SID* 2003 *Digest,* 350 discloses that when applying the hologram exposure, it is necessary to form an alignment mark on the hologram mask, so that the hologram mask can be accurately aligned to the substrate. Since this alignment mark needs to be set as readable by an optical system for alignment, the mark cannot be made simultaneously with a pattern for hologram exposure. Therefore, although the pattern for hologram exposure and the alignment mark are formed on the same hologram mask, they are possibly out of alignment for several micrometers. As such, no matter how accurately the hologram mask is aligned on the substrate using the alignment mark, the coherent pattern formed on the substrate will be out of alignment.

SUMMARY OF THE INVENTION

In order to correct the gap between the pattern for hologram exposure and the alignment mark, the pattern for hologram exposure may be provided with a vernier pattern for correcting the gap. Since the accuracy that the vernier pattern is able to sense is 0.2 µm at best, it cannot be used when higher accuracy is required.

In consideration of the above and/or other problems, exemplary embodiments of the present invention provide a method of hologram exposure that is capable of accurately measuring and correcting the gap between the pattern for hologram exposure and the alignment mark so as to make accurate alignment.

Exemplary embodiments of the present invention also provide a hologram mask for providing such hologram exposure and a semiconductor circuit substrate using the hologram mask.

A method of exposure according to one exemplary aspect of the present invention includes providing a mask for hologram exposure including a first alignment mark that is readable with an alignment optical system and a hologram exposure area to which a hologram is recorded by hologram exposure so as to form a desirable coherent pattern and a second alignment mark on a substrate. Exemplary aspects further include performing test hologram exposure with the mask for hologram exposure aligned to the substrate based on the first alignment mark, obtaining an amount of a gap between the first alignment mark and the hologram exposure area based on the second alignment mark formed on the substrate, calculating an amount of correction based on the gap, and performing hologram exposure with the mask for hologram exposure aligned to the substrate based on the amount of correction and the first alignment mark.

The above-mentioned method of exposure may further include removing a photosensitive resist from the substrate on which the test exposure is performed, and then applying another photosensitive resist on the substrate subsequent to obtaining the amount of the gap. This makes it possible to manufacture a semiconductor substrate using the substrate on which the test exposure is performed.

The above-mentioned method of exposure may further include recording the amount of correction, and also the substrate preferably is exposed in plural number based on the amount of correction in the step of performing hologram exposure.

In the above-mentioned exemplary method of exposure, it is preferable that the second alignment mark is provided in plural number, and the alignment mark provided in plural number is placed separately from each other in the hologram exposure area.

In the above-mentioned exemplary method of exposure, it is preferable that the second alignment mark is provided in plural number, and the alignment mark provided in plural number is placed separately from each other in the hologram exposure area.

A mask for hologram exposure according to another exemplary aspect of the present invention includes a hologram exposure area to which a hologram is recorded by hologram exposure so as to form a desirable coherent pattern on a substrate, and a first alignment mark that is readable with an alignment optical system. In the mask for hologram exposure, a second alignment mark forming pattern to which a hologram is recorded by hologram exposure so as to form a coherent pattern to be a second alignment mark on the substrate is formed in the hologram exposure area.

A semiconductor device and electronic equipment according to another exemplary aspect of the present invention include a semiconductor substrate manufactured by the above-mentioned method of exposure.

BRIEF DESCRIPTION OF THE DRAWINGS

FIG. 1 is a schematic plan view showing original masks used for exposure according to one exemplary embodiment of the present invention;

FIG. 2 is a schematic that shows a method for forming a hologram mask according to one exemplary embodiment of the present invention using the above-mentioned original masks;

DETAILED DESCRIPTION OF PREFERRED EMBODIMENTS

Figure 3:
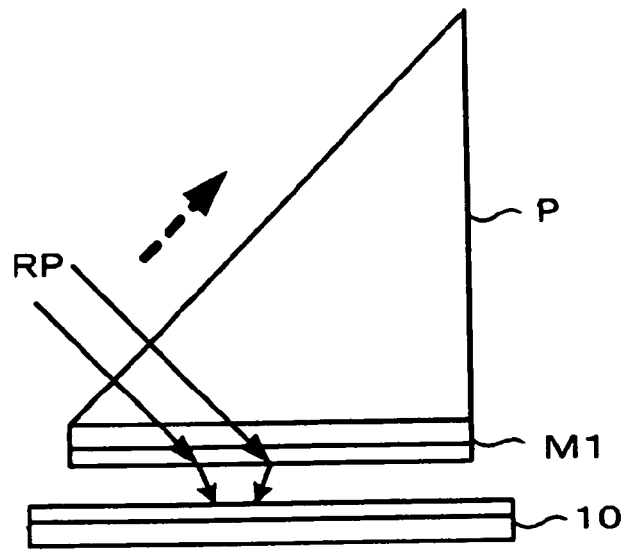
FIG. 3 is a schematic that shows a method for recording a patter of the original mask on the substrate using the hologram mask.

Preferred exemplary embodiments of the present invention will now be described with reference to the accompanying drawings.

FIG. 1 is a schematic plan view showing original masks used for exposure according to one exemplary embodiment of the present invention. FIG. 1A shows a mask pattern used for exposure of a lower layer (first layer, for example). FIG. 1B shows a mask pattern used for exposure of an upper layer (second layer, for example). These original masks OR1 and OR2 are formed by patterning, for example, a chrome film, which blocks light, on a transparent substrate. The original masks OR1 and OR2 include hologram exposure areas D1 and D2, respectively, having a pattern for forming a semiconductor device, and first alignment marks A1 through A4 provided outside of the hologram exposure areas. Provided in the hologram exposure areas D1 and D2 are second alignment marks AL1 through AL4.

The second alignment marks A1 through A4 are preferably provided separately from each other in the hologram exposure areas D1 and D2, and are preferably provided at each corner of the hologram exposure areas D1 and D2.

FIG. 2 shows a method to form a hologram mask according to one exemplary embodiment of the present invention using the above-mentioned original masks. A hologram mask M2 is manufactured by forming a hologram pattern by using the original mask OR2 on a substrate on which a photosensitive material is applied. FIG. 2A shows a step of recording the hologram exposure area D2 in the hologram mask M2. FIG. 2B shows a step of recording the first alignment marks A1 through A4 in the hologram mask M2. The substrate of the hologram mask is provided face to face with the original mask OR2 in a hologram recording device.

With this exposure device, it is possible to pass exposure beam OB from the original mask OR2 side to the hologram mask M2 side, and pass reference beam RF whose light wave has the same wavelength as the exposure beam OB from the side opposite to the original mask to the hologram mask. In an area closer to the light source of the exposure beam OB than the original mask OR2, a light shielding plate S is partially provided so as to reduce or prevent the hologram mask M2 from being exposed to light. The reference beam RF is projected onto the hologram mask M2 through a prism P. On the hologram mask M2, the exposure beam OB and the reference beam RF are coherent and the hologram mask is exposed to a pattern of coherent intensity. Thus, the pattern of the original mask OR2 is recorded in the hologram mask M2.

Here, the light shielding plate S covers the first alignment marks A1 through A4 to protect from the light when recording the hologram exposure area D2 of the hologram mask M2 as shown in FIG. 2A, and covers the hologram exposure area D2 to protect from the light when recording the alignment marks A1 through A4 as shown in FIG. 2B. When recording the hologram exposure area D2 as shown in FIG. 2A, the pattern for hologram exposure that is apparently different from the original mask OR2 is formed, since the reference beam RF is also used. When recording the first alignment marks A1 through A4 as shown in FIG. 2B, the reference beam is not used and the pattern that is apparently the same as the original mask OR2 is formed.

The hologram mask M2 for the upper layer is thus formed. When forming the hologram mask M1 for the lower layer, the light shielding plate S shown in FIG. 2A is not used. An area including the hologram exposure area D1 and the first alignment mark is recorded in the hologram mask M1 for the lower layer with a pattern of coherent intensity formed by the exposure beam OB and the reference beam RF.

Figure 4:
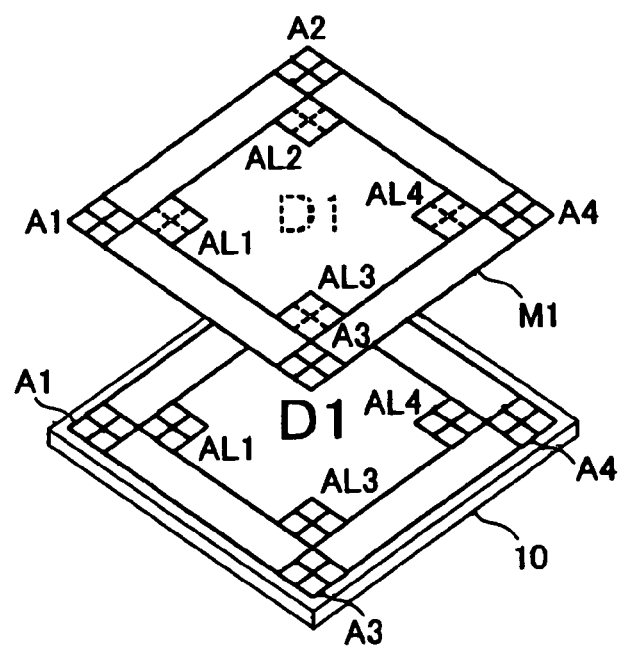
FIG. 4 is a schematic that shows the correspondence between the patterns formed on the hologram mask for the lower layer and on the substrate.

Then, the pattern of the lower layer is provided on the substrate by using the hologram mask M1 for the lower layer. FIG. 3 shows a step of reproducing information on the pattern of the original mask OR1 recorded in the hologram mask M1. A substrate 10 made of glass, for example, on which a sensitive material is applied is provided face to face with the hologram mask M1 in an exposure device. The distance between the substrate and the mask is set equal to the distance between the hologram mask M1 and the original mask OR1 provided face to face in forming the hologram mask M1. Reproduction beam RP whose light wave has the same or similar wavelength as the exposure beam OB and the reference beam RF is projected onto the back surface of the hologram mask M1 from the direction opposite to the direction in which the reference beam RF used in forming the hologram mask M1 is projected through the prism P. Passing through the recording layer of the mask, the reproduction beam RP produces an image and reproduces a pattern image of the original mask OR1 upon reaching the surface of the substrate 10 on which the sensitive material is applied. FIG. 4 shows the correspondence between the patterns formed on the hologram mask for the lower layer and on the substrate.

Then, test exposure is performed on the substrate 10 by using the hologram mask M1 for the upper layer. The test exposure here is performed in the manner similar to the exposure of the lower layer. When using the hologram mask for the upper layer, alignment between the first alignment marks A1 through A4 of the lower layer that have been transcribed on the substrate 10 and the first alignment marks A1 through A4 formed on the hologram mask M2 for the upper layer is required. Here, the device pattern and the second alignment marks AL1 through AL4 recorded in the hologram exposure area D2 of the hologram masks M2 for the upper layer cannot be observed with an alignment microscope. Therefore, the first alignment marks A1 through A4 are needed for the alignment.

Figure 5:
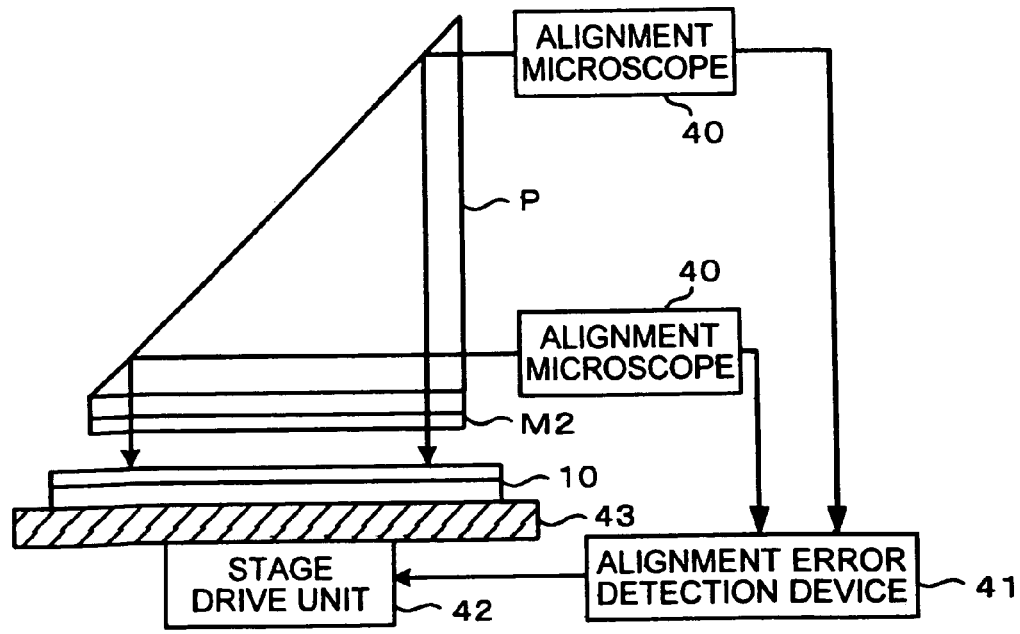
FIG. 5 is a schematic that shows a system to control alignment.

FIG. 5 is a schematic that shows a system to control the alignment. An alignment microscope 40 is slidably provided so as to observe the first alignment marks A1 through A4 of the lower layer formed on the substrate 10 through the prism P and the first alignment marks A1 through A4 of the hologram mask M2 for the upper layer. Images of the first alignment marks A1 through A4 in the upper layer and the lower layer are read out with the alignment microscope 40 and output to an alignment error detection device 41. Subsequently, the alignment error detection device 41 detects alignment errors, and then sends a feedback to a stage drive unit 42 provided to a substrate stage 43 so as to make accurate alignment.

Figure 6:
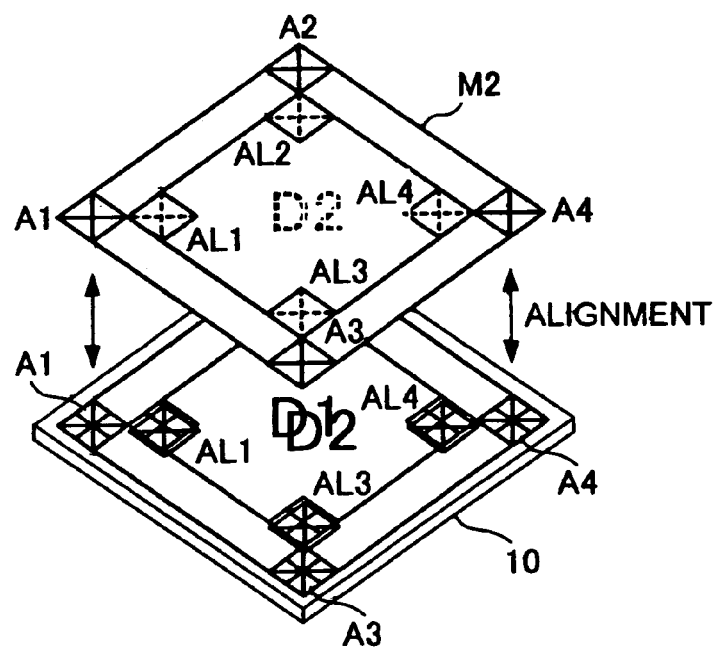
FIG. 6 is a schematic that shows a pattern formed on the substrate as a result of test exposure using a hologram mask M2 for the upper layer.

FIG. 6 is a schematic that shows a pattern formed on the substrate 10 as a result of the test exposure using the hologram mask M2 for the upper layer. Although the first alignment marks A1 through A4 of the upper layer and the lower layer are well aligned, the second alignment marks AL1 through AL4 in the hologram exposure areas D1 and D2, that is, the device patterns in the hologram exposure areas D1 and D2 are not aligned between the upper layer and the lower layer. This is because the first alignment marks A1 through A4 is not aligned to the pattern of the hologram exposure area D2 in the hologram mask M2.

In order to measure the amount of gaps between them, the second alignment marks AL1 through AL4 in the hologram exposure areas D1 and D2 that are reproduced on the substrate 10 are used. The second alignment marks AL1 through AL4 are observed with the alignment microscope 40 and the alignment error detection device 41.

Figure 7:
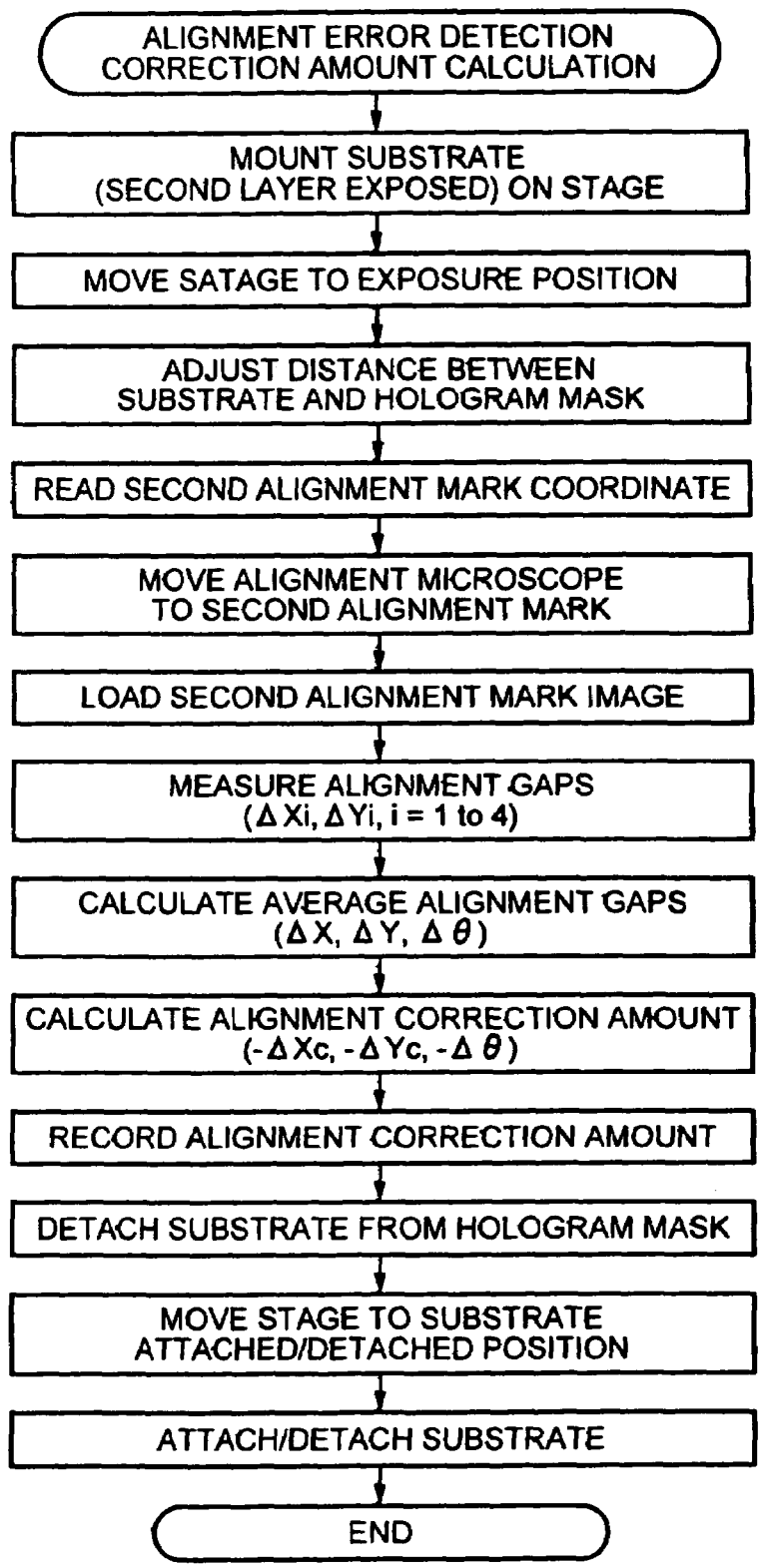
FIG. 7 is a flowchart showing the process of measuring the amount of gaps in second alignment marks and calculating the amount of correction.

FIG. 7 shows the process of observing the second alignment marks AL1 through AL4, measuring the amount of gaps using the alignment error detection device 41, and calculating the required amount of correction.

Figure 8:
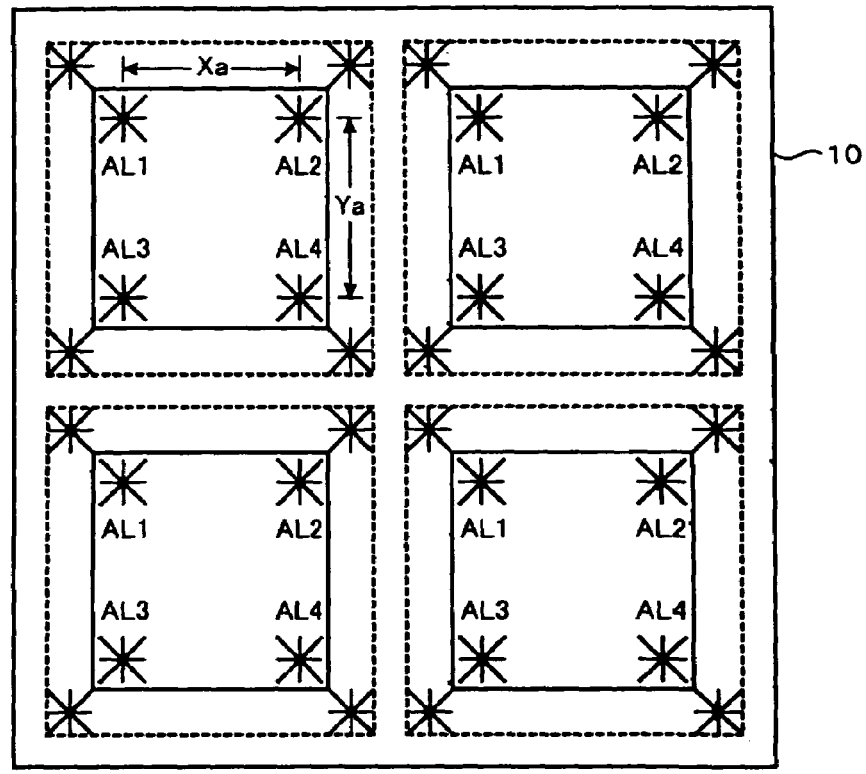
FIG. 8 is a schematic that shows an example configuration on the substrate by a method of hologram exposure of one exemplary embodiment of the present invention.

FIG. 8 is a schematic that shows an example configuration on the substrate by the method of hologram exposure of the present exemplary embodiment. In this drawing, a pattern is formed at four places by performing exposure for four times each using one hologram mask on the substrate 10. Referring to FIG. 8, a method for calculating the amount of correction based on the amount of gaps in the second alignment marks AL1 through AL4 will now be described.

A second alignment mark ALi (i=1 through 4) in the pattern is considered to have the amount of gaps $\Delta Xi$ (i=1 through 4) in the X-direction and $\Delta Yi$ (i=1 through 4) in the Y-direction. The average amount (offset $\Delta X$, $\Delta Y$) is calculated as follows:

$$\Delta X=(\Delta X1+\Delta X2+\Delta X3+\Delta X4)/4$$

$$\Delta Y=(\Delta Y1+\Delta Y2+\Delta Y3+\Delta Y4)/4$$

Also, with the distance among the second alignment marks Xa in the X-direction and Ya in the Y-direction, the rotation angle $\Delta\theta$ is calculated as follows:

$$\Delta\theta=((\Delta Y2-\Delta Y1)/Xa+(\Delta Y3-\Delta Y4)/Xa+(\Delta X1-\Delta X3)/Ya+(\Delta X4-\Delta X2)/Ya)/4$$

Therefore, the amount of alignment correction ($\Delta Xc$, $\Delta Yc$, $\Delta\theta c$) is calculated as follows:

$$\Delta Xc=-\Delta X$$

$$\Delta Yc=-\Delta Y$$

$$\Delta\theta c=-\Delta\theta$$

Figure 9:
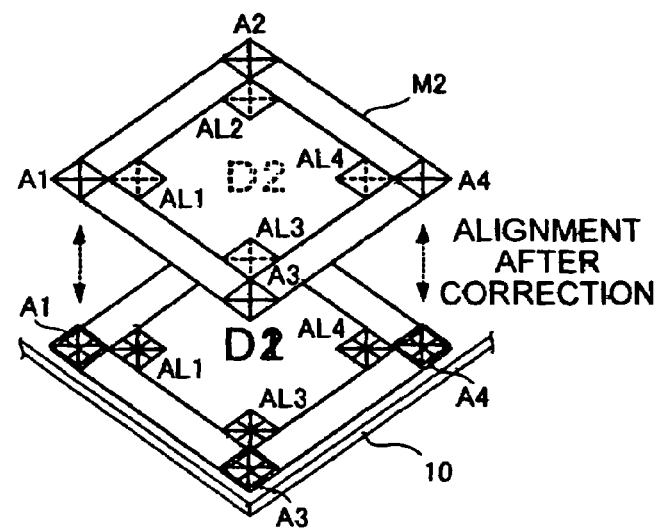
FIG. 9 is a schematic that shows an example of hologram exposure with the hologram mask M2 for the upper layer corrected and aligned to the substrate.

After calculating the amount of correction, data of the amount of correction are stored in a memory. Subsequently, hologram exposure of the upper layer is performed based on the amount of correction and the first alignment marks A1 through A4. FIG. 9 is a schematic that shows an example of hologram exposure with the hologram mask M2 for the upper layer corrected and aligned to the substrate 10. While the first alignment marks A1 through A4 are not aligned due to the correction, the second alignment marks AL1 through AL4 in the hologram exposure areas D1 and D2 on the substrate 10 are well aligned.

Thus, the alignment is completed in the hologram exposure areas, and thereby increasing reliability of semiconductor substrates and providing miniaturized configurations. In addition, this method provides accurate alignment with one test exposure, and thereby significantly increasing manufacturing efficiency.

Next, a thin-film transistor using a semiconductor substrate manufactured by the exposure method according to exemplary embodiments of the present invention will be described. A thin-film transistor using a semiconductor substrate manufactured by the method according to exemplary embodiments of the present invention is applicable to pixel circuits that form each pixel included in EL displays and liquid crystal displays, and to drivers (integrated circuits) to control such pixel circuits.

Figure 10:
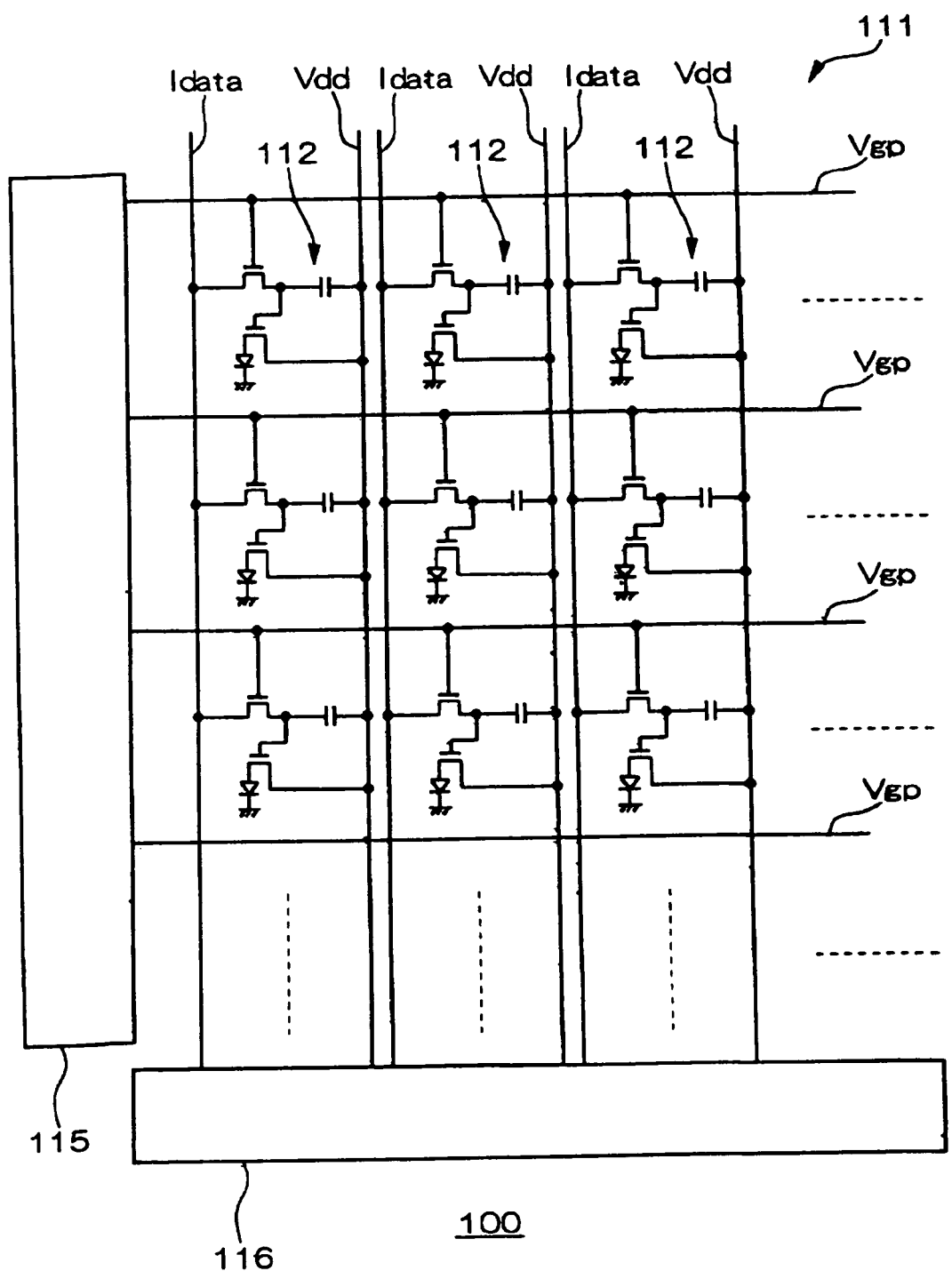
FIG. 10 is a schematic showing an example configuration of an electro-optical device.

FIG. 10 is a schematic that shows an example configuration of an electro-optical device. An electro-optical device 100 (display) of the present exemplary embodiment includes a circuit substrate (active matrix substrate) and drivers 115 and 116. The circuit substrate includes a pixel circuit 112 having two thin-film transistors, a capacitor, and a light-emitting element. The pixel circuit 112 is provided in a pixel area 111 on the substrate in matrix form. The drivers 115 and 116 provide the pixel circuit 112 with driving signals. The driver 115 provides each pixel area with driving signals via a light-emitting control line Vgp. The driver 116 provides each pixel area with driving signals via a data line Idata and a power line Vdd. By controlling a scan line Vsel and the data line Idata, a current flow to each pixel is programmed and light emitted by the light-emitting element is controlled. The manufacturing method of the above-mentioned exemplary embodiment is applicable to each thin-film transistor included in the pixel circuit and the thin-film transistor included in the drivers 115 and 116. While the organic EL display is given as an example of the electro-optical device here, it is also possible to manufacture various types of electro-optical devices such as liquid crystal displays in the same manner.

Figure 11A:
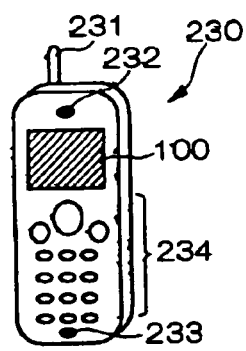
FIG. 11 is a schematic that shows examples of electronic equipment to which an electro-optical device 100 is applicable.

Now, several types of electronic equipment to which the electro-optical device 100 is applicable will be described. FIGS. 11A–F show examples of electronic equipment to which the electro-optical device 100 is applicable. FIG. 11A shows a mobile phone as one application example. A mobile phone 230 includes an antenna part 231, an audio output part 232, an audio input part 233, an operating part 234, and the electro-optical device 100.

Figure 11B:
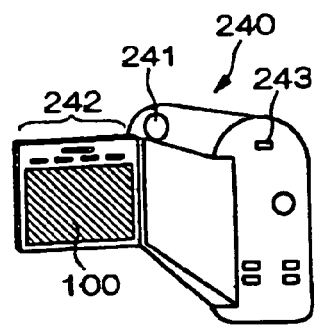

FIG. 11B shows a camcorder as another application example. A camcorder 240 includes an image reception part 241, an operating part 242, an audio input part 243, and the electro-optical device 100.

Figure 11C:
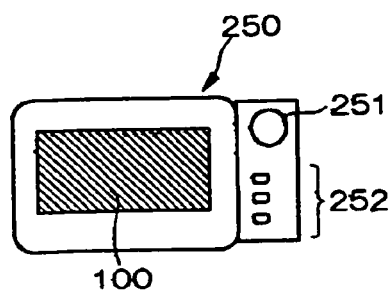

FIG. 11C shows a mobile personal computer, or a so-called personal digital assistant (PDA), as another application example. A personal computer 250 includes a camera part 251, an operating part 252, and the electro-optical device 100.

Figure 11D:
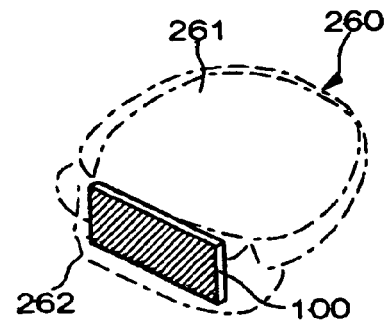
Figure 11E:
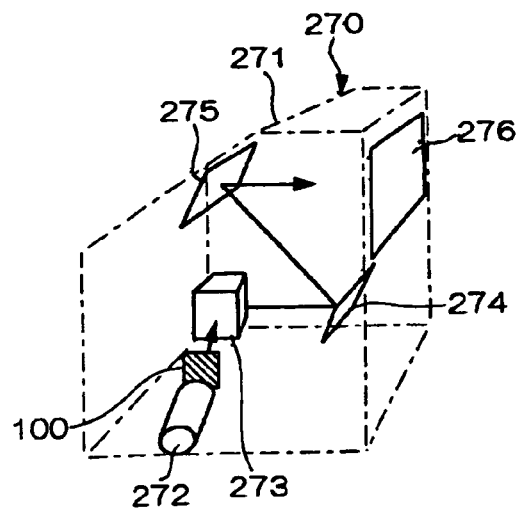

FIG. 11D shows a head-mount display as another application example. A head-mount display 260 includes a band 261, an optical system housing 262, and the electro-optical device 100.

FIG. 1E is a rear projector as another application example. A projector 270 includes a case 271, a light source 272, a synthetic optical system 273, mirrors 274 and 275, a screen 276, and the electro-optical device 100.

Figure 11F:
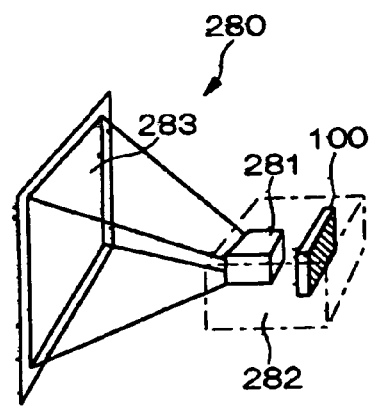

FIG. 11F is a front projector as another application example. A projector 280 includes an optical system 281 and the electro-optical device 100 in a case 282. The projector displays images on a screen 283.

As mentioned above, the electro-optical device of exemplary embodiments of the present invention is applicable to image display sources. The application is not limited to the above-mentioned examples, and the electro-optical device is applicable to various types of electronic equipment including displays such as organic EL displays and liquid crystal displays. Other examples may include fax-machine built-in displays, digital camera finders, mobile TVs, electronic notebooks, electronic bulletin boards, and advertising displays.

The manufacturing method of the above-mentioned exemplary embodiment is also applicable to manufacturing of various devises as well as manufacturing of electro-optical devices. Examples of such devices include various types of memories such as ferroelectric RAM (FeRAM), SRAM, DRAM, NOR RAM, NAND RAM, floating gate nonvolatile memories, and magnetic RAM (HAM). Furthermore, the method is applicable to economical manufacturing of tags on which micro circuit chips (IC chips) are mounted that are used for noncontact communications system utilizing microwaves.

What is claimed is:

1. A method of hologram exposure, comprising:
   preparing a substrate where a first alignment mark and a second alignment mark are formed;
   providing a mask for hologram exposure, the mask including:
     a third alignment mark that is readable with an alignment optical system; and
     a hologram pattern that is recorded so as to form a desirable device pattern and a fourth alignment mark on the substrate by hologram exposure;
   performing a test hologram exposure with the mask for hologram exposure aligned to the substrate by aligning the first alignment mark formed on the substrate and the third alignment mark formed on the mask for hologram exposure;
   obtaining an amount of a gap between the second alignment mark formed on the substrate and the fourth alignment mark formed on the substrate by the test hologram exposure;
   calculating an amount of correction based on the gap; and
   performing a hologram exposure with the mask for hologram exposure aligned to the substrate based on at least the amount of correction.

2. The method of hologram exposure according to claim 1, further comprising:
   applying a first photosensitive resist on the substrate;
   removing the first photosensitive resist from the substrate on which the test exposure is performed; and
   applying a second photosensitive resist on the substrate on which the first photosensitive resist is removed subsequent to obtaining the amount of the gap.

3. The method of hologram exposure according to claim 1, further comprising the step:
   storing the amount of correction,
   wherein after the exposure,
     a step is performed, at least one time, in which another substrate is prepared on which a first alignment mark and a second alignment mark are formed, the mask is positioned on the another substrate based on at least the amount of correction, and hologram exposure is performed.

4. The method of hologram exposure according to claim 1, the hologram pattern is formed in a hologram exposure area, the hologram pattern including:
   a device pattern; and
   more than two fifth alignment marks;
   the fifth alignment marks being provided, and being placed separately from each other in the hologram exposure area.

5. The method of hologram exposure according to claim 4, the fifth alignment marks being placed at four corners of the hologram exposure area.

6. A mask for hologram exposure, comprising:
   a device pattern is recorded so as to form a desirable coherent pattern on a substrate by hologram exposure, being formed in a hologram exposure area of the mask;
   a first alignment mark that is readable with an alignment optical system; and
   a second alignment mark recorded so as to form a third alignment mark on the substrate by hologram exposure, being formed in the hologram exposure area of the mask.

7. A method of manufacturing a semiconductor device, comprising:
   providing a predetermined device on a substrate;
   preparing a substrate where a first alignment mark and a second alignment mark are formed;
   forming the device by providing a mask for hologram exposure, the mask including a third alignment mark that is readable with an alignment optical system, and a hologram pattern that is recorded so as to form a desirable device pattern and fourth alignment mark on the substrate by hologram exposure;
   performing test hologram exposure with the mask for hologram exposure aligned to the substrate by aligning the first alignment mark formed on the substrate and the third alignment mark formed on the mask for hologram exposure;
   obtaining an amount of a gap between the second alignment mark formed on the substrate and the fourth alignment mark formed on the substrate by the test hologram exposure;
   calculating an amount of correction based on the gap;
   performing a hologram exposure with the mask for hologram exposure aligned to the substrate based on at least the amount of correction; and
   providing process treatment.

8. A method of manufacturing an electronic equipment, comprising:
   providing a predetermined device on a substrate;
   preparing a substrate where a first alignment mark and a second alignment mark are formed;
   forming the device by providing a mask for hologram exposure, the mask including a third alignment mark that is readable with an alignment optical system, and a hologram pattern that is recorded so as to form a desirable device pattern and fourth alignment mark on the substrate by hologram exposure;
   performing test hologram exposure with the mask for hologram exposure aligned to the substrate by aligning the first alignment mark formed on the substrate and the third alignment mark formed on the mask for hologram exposure;
   obtaining an amount of a gap between the second alignment mark formed on the substrate and the fourth alignment mark formed on the substrate by the test hologram exposure;
   calculating an amount of correction based on the gap;
   performing a hologram exposure with the mask for hologram exposure aligned to the substrate based on at least the amount of correction; and
   providing process treatment.

9. The method of hologram exposure according to claim 1,
wherein after the step of providing the mask, before the test exposure step, a step of preparing the substrate is performed.

10. The method of hologram exposure according to claim 1,
wherein the exposure step is further provided with a step in which the mask is positioned on the substrate by positioning the first alignment mark of the substrate and the third alignment mark of the mask, and by moving the hologram exposure mask by the amount of correction, with reference to the first alignment mark.

11. A method of hologram exposure, comprising:
preparing a substrate where a first alignment mark and a second alignment mark are formed;
providing a mask for hologram exposure, the mask including:
 a first alignment mark that is readable with an alignment optical system; and
 a hologram pattern that is recorded so as to form a desirable device pattern and a third alignment mark on the substrate by hologram exposure;
performing a test hologram exposure with the mask for hologram exposure aligned to the substrate by aligning the first alignment mark of the mask and the first alignment mark of the substrate;
obtaining an amount of a gap between the second alignment mark formed on the substrate and the third alignment mark formed at the substrate;
calculating an amount of correction based on the gap; and
performing a hologram exposure with the mask for hologram exposure aligned to the substrate based on at least the amount of correction.

* * * * *